United States Patent
Lin et al.

(10) Patent No.: US 10,662,519 B2
(45) Date of Patent: May 26, 2020

(54) MASK, METHOD FOR MANUFACTURING THE SAME, AND MASK ASSEMBLY

(71) Applicants: BOE Technology Group Co., Ltd., Beijing (CN); Ordos Yuansheng Optoelectronics Co., Ltd., Inner Mongolia (CN)

(72) Inventors: Zhiming Lin, Beijing (CN); Zhen Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 3 days.

(21) Appl. No.: 15/745,338

(22) PCT Filed: Jun. 13, 2017

(86) PCT No.: PCT/CN2017/088040
§ 371 (c)(1),
(2) Date: Jan. 16, 2018

(87) PCT Pub. No.: WO2018/019045
PCT Pub. Date: Feb. 1, 2018

(65) Prior Publication Data
US 2019/0010601 A1    Jan. 10, 2019

(30) Foreign Application Priority Data

Jul. 29, 2016    (CN) .......................... 2016 1 0617389

(51) Int. Cl.
*C23C 14/04*        (2006.01)
*B05C 21/00*        (2006.01)
(Continued)

(52) U.S. Cl.
CPC .......... *C23C 14/042* (2013.01); *B05C 21/005* (2013.01); *C23C 14/24* (2013.01); *H01L 51/56* (2013.01); *H01L 51/0011* (2013.01)

(58) Field of Classification Search
None
See application file for complete search history.

(56) References Cited

U.S. PATENT DOCUMENTS 8,656,859 B2    2/2014    Hong et al.
8,881,676 B2    11/2014   Hong
(Continued)

FOREIGN PATENT DOCUMENTS

CN    102201550 A    9/2011
CN    102760842 A    10/2012
(Continued)

OTHER PUBLICATIONS

First Office Action, including Search Report, for Chinese Patent Application No. 201610617389.3, dated Jan. 24, 2018, 18 pages.
(Continued)

*Primary Examiner* — Binu Thomas
(74) *Attorney, Agent, or Firm* — Westman, Champlin & Koehler, P.A.

(57) ABSTRACT

A mask, a method for manufacturing a mask, and a mask assembly are disclosed. The mask includes an effective region for evaporation and an edge region between an edge of the effective region for evaporation extending in a stretching direction and an edge of the mask extending in the stretching direction. The edge region is provided with a bending relieving structure for relieving a curling of the edge of the effective region for evaporation when the mask is stretched in the stretching direction.

16 Claims, 4 Drawing Sheets

(51) Int. Cl.
*H01L 51/56* (2006.01)
*C23C 14/24* (2006.01)
*H01L 51/00* (2006.01)

(56) References Cited

U.S. PATENT DOCUMENTS

| | | |
|---|---|---|
| 9,192,959 B2 | 11/2015 | Hong |
| 9,346,078 B2 | 5/2016 | Oh et al. |
| 9,605,336 B2 | 3/2017 | Xiong et al. |
| 2011/0229633 A1 | 9/2011 | Hong et al. |
| 2011/0265714 A1* | 11/2011 | Lee ................... C23C 14/042 118/504 |
| 2012/0266813 A1* | 10/2012 | Hong ................. C23C 14/042 118/505 |
| 2014/0065355 A1 | 3/2014 | Kang |
| 2014/0150721 A1* | 6/2014 | Oh ..................... C23C 14/042 118/504 |
| 2015/0007768 A1* | 1/2015 | Lee ................... C23C 14/042 118/504 |
| 2015/0027367 A1 | 1/2015 | Hong |
| 2015/0159266 A1 | 6/2015 | Lim et al. |
| 2015/0376765 A1 | 12/2015 | Xiong et al. |
| 2017/0179390 A1* | 6/2017 | Baek ..................... C23C 16/042 |
| 2018/0148823 A1* | 5/2018 | Yoo ...................... C23C 14/042 |

FOREIGN PATENT DOCUMENTS

| | | | |
|---|---|---|---|
| CN | 103668056 A | | 3/2014 |
| CN | 103855325 A | | 6/2014 |
| CN | 104062842 A | | 9/2014 |
| CN | 204434717 U | * | 7/2015 |
| CN | 204434717 U | | 7/2015 |
| CN | 204434720 U | | 7/2015 |
| CN | 106086785 A | | 11/2016 |
| JP | 2006-92752 A | | 4/2006 |
| JP | 2009-41061 A | | 2/2009 |

OTHER PUBLICATIONS

International Search Report and Written Opinion for International Application No. PCT/CN2017/088040, dated Aug. 16, 2017, 10 pages.

English translation of International Search Report and Box V of the Written Opinion for International Application No. PCT/CN2017/088040, dated Aug. 16, 2017, 7 pages.

* cited by examiner

MASK, METHOD FOR MANUFACTURING THE SAME, AND MASK ASSEMBLY

CROSS-REFERENCE TO RELATED APPLICATION

This application is a Section 371 National Stage Application of International Application No. PCT/CN2017/088040, filed on Jun. 13, 2017, entitled "MASK, METHOD FOR MANUFACTURING THE SAME, AND MASK ASSEMBLY", which claims priority to Chinese Patent Application No. 201610617389.3 filed on Jul. 29, 2016 with SIPO, incorporated herein by reference in entirety.

BACKGROUND

Technical Field

Embodiments of the present disclosure relate to the field of display technology, and in particular, to a mask, a method for manufacturing a mask, and a mask assembly.

Description of the Related Art

Currently, organic electroluminescent display (Organic Light Emitting Diode, OLED) have gradually become prominent in the display field due to their excellent performance in terms of low power consumption, high color saturation, wide viewing angle, small thickness and flexibility.

An OLED display panel includes a plurality of sub-pixel units arranged in an array. Each sub-pixel unit includes an anode, a light-emitting layer and a cathode. The light-emitting layer is formed from an organic light-emitting material. Currently, the light-emitting layer is typically formed in each sub-pixel unit by a mask (for example, a fine metal mask, abbreviated as FMM) and an evaporation process. During the evaporation process, the mask needs to be firstly welded to a frame and then placed inside an evaporation machine. A combination of the mask and the frame welded together is called as MFA (Mask Frame Assembly) or MA (Mask Assembly). When the mask is welded to the frame, the mask is made in a stretched state under the action of the frame, thereby various degrees of curling problems easily occur at edges on both sides of an effective region for evaporation on the mask, and further defects tend to occur at corresponding positions of a product to be coated in the evaporation process.

SUMMARY

A technical solution of the present disclosure provides a mask, comprising an effective region for evaporation and an edge region between an edge of the effective region for evaporation extending in a stretching direction and an edge of the mask extending in the stretching direction, wherein the edge region is provided with a bending relieving structure for relieving a curling of the edge of the effective region for evaporation when the mask is stretched in the stretching direction.

Optionally, the bending relieving structure comprises a first strip-shaped structure extending in a direction which is not parallel to the stretching direction.

Optionally, the extending direction of the first strip-shaped structure is perpendicular to the stretching direction.

Optionally, the bending relieving structure further comprises a second strip-shaped structure intersecting with the first strip-shaped structure.

Optionally, an extending direction of the second strip-shaped structure is parallel to the stretching direction.

Optionally, the bending relieving structure comprises a plurality of the first strip-shaped structures.

Optionally, a distance between two adjacent first strip-shaped structures decreases as a pulling force applied to the edge region increases.

Optionally, the edge region comprises a first region and a second region that are adjacent to each other in the stretching direction, a distance between the first region and a center of the effective region for evaporation is greater than a distance between the second region and the center of the effective region for evaporation, and a distance between two adjacent first strip-shaped structures in the first region is greater than a distance between two adjacent first strip-shaped structures in the second region.

Optionally, the mask comprises a plurality of mask cells, each mask cell comprising a plurality of the bending relieving structures.

Optionally, a non-hollowed-out area is arranged around a periphery of the bending relieving structure, and a thickness of the non-hollowed-out area is less than a thickness of the bending relieving structure.

Optionally, a hollowed-out area is arranged around a periphery of the bending relieving structure.

Optionally, the mask comprises a plurality of mask cells arranged in the stretching direction.

Optionally, the bending relieving structure is made from a same material as the effective region for evaporation of the mask.

The present disclosure further provides a mask assembly, comprising a frame and the mask according to any one of the above embodiments, the mask being mounted on the frame and configured to be stretched in the stretching direction.

The present disclosure further provides a method for manufacturing a mask, the mask comprising an effective region for evaporation and an edge region between an edge of the effective region for evaporation extending in a stretching direction and an edge of the mask extending in the stretching direction, wherein the method comprises:

forming the effective region for evaporation and the edge region;

forming a bending relieving structure in the edge region such that the bending relieving structure relieves a curling of the edge of the effective region for evaporation when the mask is stretched in the stretching direction.

Optionally, the forming the bending relieving structure in the edge region comprises:

forming a pattern of the bending relieving structure in the edge region by a half-etching process, such that a non-hollowed-out area is arranged around a periphery of the bending relieving structure, a thickness of the non-hollowed-out area is less than a thickness of the bending relieving structure.

Optionally, the forming the bending relieving structure in the edge region comprises:

forming a pattern of the bending relieving structure in the edge region by a full-etching process, such that a hollowed-out area is arranged around a periphery of the bending relieving structure.

Optionally, the forming the bending relieving structure in the edge region comprises:

forming a pattern of the bending relieving structure in the edge region by an attaching process.

Optionally, the bending relieving structure protruding from a plane of the mask is formed by the attaching process.

DETAILED DESCRIPTION OF PREFERRED EMBODIMENTS

The specific embodiments of the present disclosure are described in further detail below with reference to the accompanying drawings and embodiments. The following embodiments serve to illustrate the present disclosure, but are not intended to limit the scope of the present disclosure.

The technical problem to be solved by the embodiments of the present disclosure is to at least partially eliminate the curling of the edges of the effective region for evaporation due to the stretching of the mask when the conventional mask is mounted on the frame. An embodiment of the present disclosure provides a mask including at least one mask cell, the mask cell includes an effective region for evaporation and an edge region between the effective region for evaporation and a first edge of the mask. The edge region is provided with a bending relieving structure for relieving a curling of an edge of the effective region for evaporation when the mask is stretched in an extending direction of the first edge (i.e., reducing the extent of the curling of the edge of the effective region for evaporation).

In the mask according to the embodiment of the present disclosure, a bending relieving structure is provided on the mask. When the mask is stretched due to the welding of it to the frame, the curling of the edge of the effective region for evaporation on the mask can be effectively relieved by the bending relieving structure, thereby avoiding occurrence of defects in corresponding positions of the products to be coated during the evaporation process.

For example, one or more strip-shaped structures may be provided as the bending relieving structure on the above edge region of the mask, and an extending direction of the strip-shaped structure is not parallel to the extending direction of the first edge. When the mask is stretched in the extending direction of the first edge, the strip-shaped structure would be bent and deformed, so that an outward stretching effect is generated in the effective region for evaporation, thereby relieving the curling state of the edge of the effective region for evaporation. Optionally, the extending direction of the strip-shaped structure is perpendicular to the extending direction of the first edge.

Figure 1:
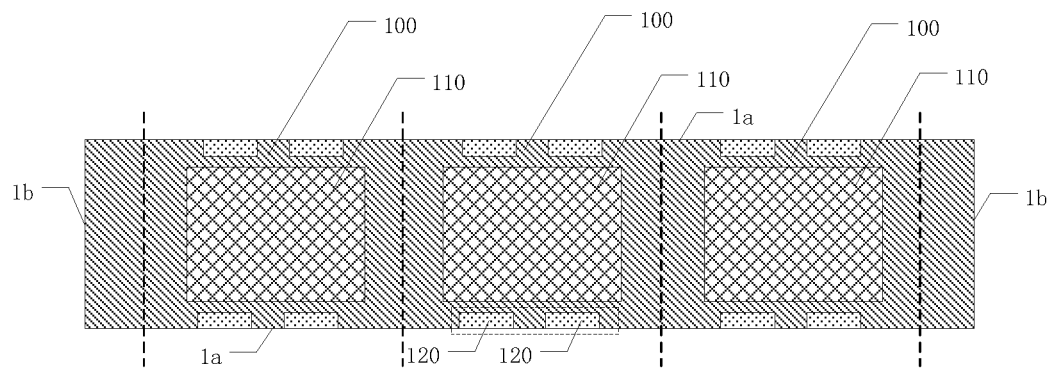
FIG. 1 is a schematic view of a mask according to an embodiment of the present disclosure.

Referring to FIG. 1, FIG. 1 is a schematic view of a mask according to an embodiment of the present disclosure. The mask has a rectangular shape and includes two first edges 1a and two second edges 1b. There are a plurality of mask cells (for example, FMM Sheet Cell) 100 arranged in the extending direction of the first edge 1a, wherein each of the mask cells 100 includes an effective region 110 for evaporation and an edge region between the effective region 110 for evaporation and the first edge 1a of the mask, the edge region is provided with a bending relieving structure 120. The bending relieving structure 120 is configured for relieving the curling of the edge of the effective region for evaporation when the mask is stretched in the extending direction of the first edge 1a.

Figure 2A:
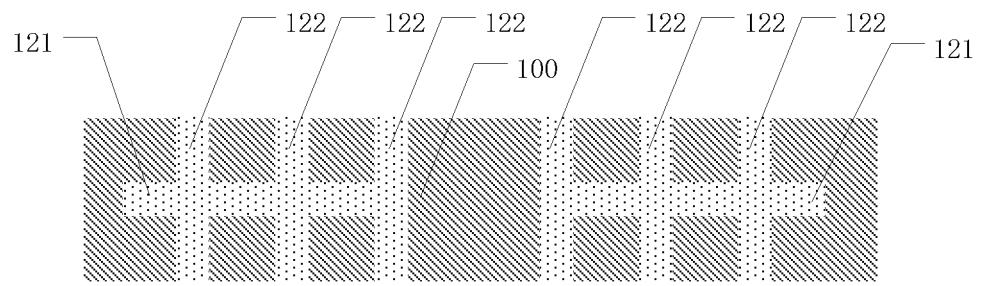
FIG. 2a is a schematic view of a bending relieving structure on a mask according to an embodiment of the present disclosure.

Referring to FIG. 2a, FIG. 2a is an enlarged schematic view of a structure in a dashed box of FIG. 1, in which each of the bending relieving structures 120 includes a second strip-shaped structure 121 and first strip-shaped structures 122 intersecting with the second strip-shaped structure 121, and the extending direction of the first strip-shaped structure 122 is not parallel to the extending direction of the first edge 1a.

Figure 3A:
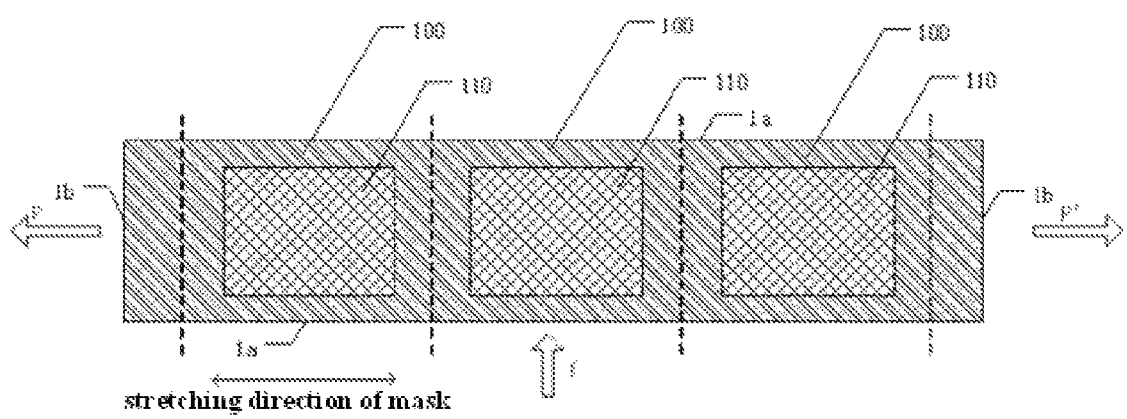
FIG. 3a is a schematic view of a mask without a bending relieving structure in a stretched state.
Figure 3B:
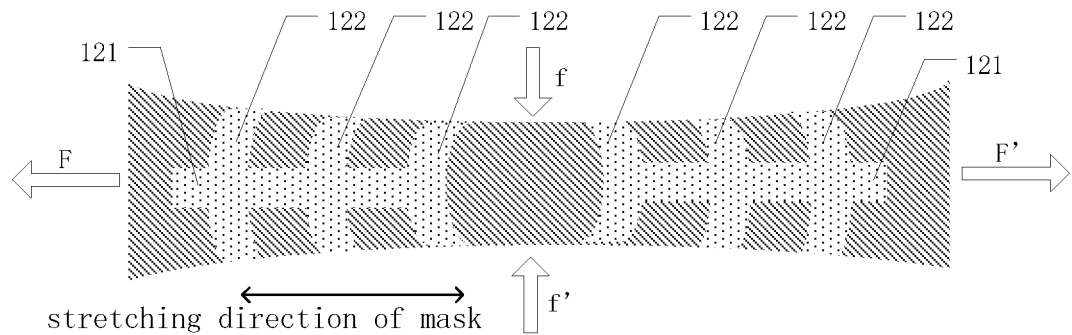
FIG. 3b is a schematic view of the bending relieving structure of FIG. 2a in a stretched state.

FIG. 3a shows a state in which a mask with no bending relieving structure is stretched. When the mask is stretched in the direction of the arrow in the figure, the stretching forces F and F' are applied to two ends of the mask in the extending direction of the first edge 1a, thus a force f is generated on the mask cell 100 to cause the effective region for evaporation 110 to contract inwardly. When the bending relieving structure is provided, as shown in FIG. 3b, when the mask is stretched in the extending direction of the first edge 1a, the stretching forces F and F' are transmitted through the second strip-shaped structure 121 to drive the first strip-shaped structure 122 to deform. The bending deformation of the first strip-shaped structure 122 may drive the outer edge of the edge region of the mask cell to contract inwardly, so that forces f and f' are generated. Since the bending relieving structure 120 and the effective region for evaporation of the mask cell are connected to each other, the inward force f exerts an outward stretching effect on the effective region 110 for evaporation by the interaction force and counteracts the force of contraction of the effective region 110 for evaporation, thereby relieving the state of curling of the edge of the effective region 110 for evaporation.

Optionally, in the bending relieving structure 120 described above, the extending direction of the first strip-shaped structure 122 is perpendicular to the extending direction of the first edge 1a and the extending direction of the second strip-shaped structure 121 is parallel to the extending direction of the first edge 1a. That is, the first strip-shaped structure 122 may be disposed perpendicularly to the second strip-shaped structure 121, so as to improve the effect of relieving the curling of the edge of the effective region for evaporation. In addition, as shown in FIG. 2a, each of the bending relieving structures 120 may include a plurality of first strip-shaped structures 122.

Optionally, a distance between two adjacent first strip-shaped structures decreases as a pulling force applied to the edge region increases. In other words, the mask would undergo more curling where the edge region is subject to a large pulling force, thus more first strip-shaped structures are provided at these positions, that is, the first strip-shaped structures have a higher density, while less first strip-shaped structures are provided where the pulling force applied to the edge region is relatively small, so that the relieving effect of the bending relieving structure on the curling of the edge of the edge region can be more uniform. The change of the distances between two adjacent first strip-shaped structures may be a linear change depending on the pulling force applied to the edge region, or may also be a simple discontinuous change.

Figure 2B:
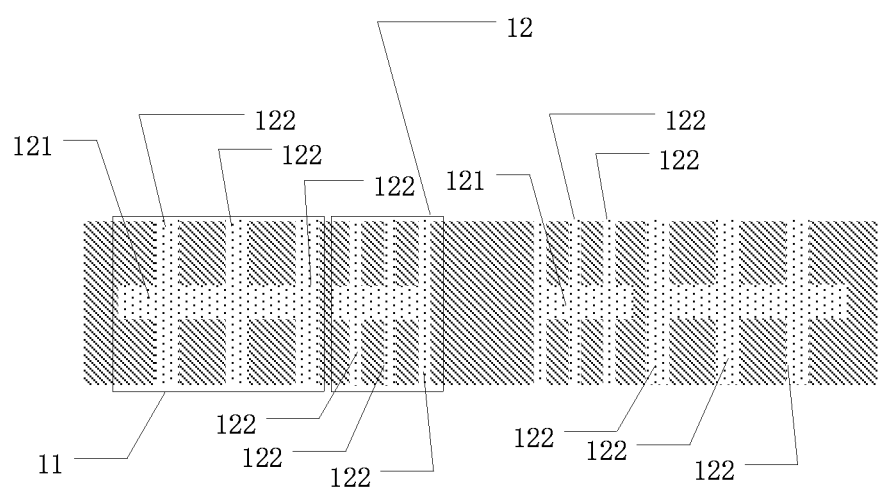
FIG. 2b is a schematic view of a bending relieving structure on a mask according to another embodiment of the present disclosure.

Optionally, in the same mask cell, the edge region includes a first region 11 and a second region 12 that are adjacent to each other in the extending direction of the first edge, a distance between the first region 11 and a center of the effective region for evaporation is greater than a distance between the second region 12 and a center of the effective region for evaporation, and a distance between two adjacent first strip-shaped structures 122 in the first region 11 is greater than a distance between two adjacent first strip-shaped structures 122 in the second region 12, as shown in FIG. 2b. That is, for the same mask cell, a larger number of the first strip-shaped structures may be disposed at a middle portion (that is, a portion of the edge region closer to the center of the effective region for evaporation) of the edge region, so as to improve the effect of relieving the curling of edge at this position. In this way, the effect of relieving the curling of edge is more significant at an upper edge of this position, thus it is beneficial to improving the effect of relieving the curling of edge on the entire edge region.

In addition, each of the bending relieving structures 120 may also only include the first strip-shaped structure 122, without providing the second strip-shaped structure 121, so as to reduce the difficulty of manufacturing the bending relieving structure.

In order to further improve the effect of relieving the edge curling of the effective region for evaporation, each of the mask cells 100 may include a plurality of bending relieving structures 120. The number of the bending relieving structures in each of the mask cells may vary depending on the edge curling degree of the effective region for evaporation thereon, for example, one bending relieving structure may be provided on each side of the effective region for evaporation in each mask cell. Alternatively, as shown in FIG. 1, two bending relieving structures may be provided on each side of the effective region for evaporation in each mask cell.

In the mask according to the embodiments of the present disclosure, a bending relieving structure is provided thereon, the bending relieving structure includes a second strip-shaped structure and a first strip-shaped structure intersecting with the second strip-shaped structure. In the stretching process, the stretching force is transmitted through the second strip-shaped structure to bend the first strip-shaped structure and drive an outer boundary of the edge region of the mask cell to move inwardly, thereby resulting in a tendency of inward contraction. During the contraction, the effective region for evaporation of the mask cell may be stretched outwardly to relieve the curling of the edge of the effective region for evaporation, thereby avoiding occurrence of defects in corresponding positions of the products to be coated during the evaporation process.

In order to form the above-described bending relieving structure, the edge region of the conventional mask may be etched to form the above-mentioned bending relieving structure by an etching process. If the bending relieving structure is formed by an etching process, the bending relieving structure and the structure of the effective region for evaporation of the mask cell are made from the same material.

Figure 6:
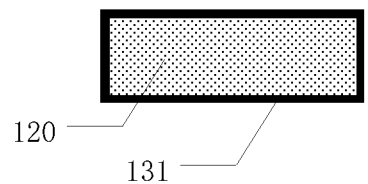
FIG. 6 is a schematic view of a non-hollowed-out area arranged around a periphery of the bending relieving structure according to an embodiment of the present disclosure.

For example, the edge region of the mask may be half-etched. After the half-etching process is performed, the bending relieving structure is a raised structure of the formed edge region, a non-hollowed-out area 131 is arranged around a periphery of the bending relieving structure 120, a thickness of the non-hollowed-out area 131 is less than a thickness of the bending relieving structure 120, that is, a height of the surface of the bending relieving structure 120 is greater than a height of the surface of the periphery thereof, as shown in FIG. 6.

Figure 4:
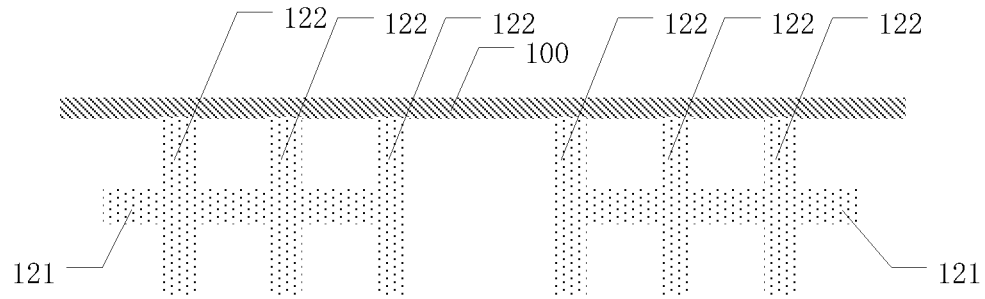
FIG. 4 is a schematic view of another bending relieving structure on a mask according to an embodiment of the present disclosure.
Figure 7:
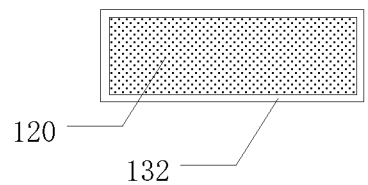
FIG. 7 is a schematic view of a hollowed-out area arranged around a periphery of the bending relieving structure according to an embodiment of the present disclosure.

Optionally, the periphery of the bending relieving structure may also be fully-etched so that a hollowed-out area 132 is arranged around the periphery of the bending relieving structure 120 (see FIG. 7). The structure thereof is shown in FIG. 4. In this way, the first strip-shaped structure 122 of the bending relieving structure is allowed to obtain a larger bending effect, so as to exert a larger stretching effect on the effective region for evaporation of the mask, thereby further relieving the curling state of the edge of the effective region for evaporation.

Alternatively, the pattern of the bending relieving structure may be formed on the edge region by an attaching process, for example, the material for forming the bending relieving structure is attached to the lower surface of the mask (i.e., the surface for evaporation of the mask) at the edge region, so as to form the bending relieving structure protruding from a plane of the mask. In this case, the bending relieving structure may be made from the same material or a different material from the structure of the effective region for evaporation of the mask cell. In addition to the raised structure, the bending relieving structure may also be of a concave portion as long as the shape of the bending relieving structure is designed in such a way that it drives the effective region for evaporation of the mask cell to be stretched outwardly during the stretching, for example, the bending relieving structure may be configured to form an oval (or rugby ball-shaped) area having a major axis extending in a direction in which the mask is stretched, and a concave portion recessed relative to the outer portion is formed in the oval area. During the stretching, due to the combination of the bending relieving structure and the mask cell, the effective region for evaporation of the mask cell is stretched outwardly to relieve the edge curling of the effective region for evaporation, thereby avoiding occurrence of defects in corresponding positions of the products to be coated during the evaporation process.

In addition, an embodiment of the present disclosure further provides a mask assembly, comprising a frame and the mask described above, the mask being mounted on the frame and configured to be stretched in the extending direction of the first edge.

Figure 5:
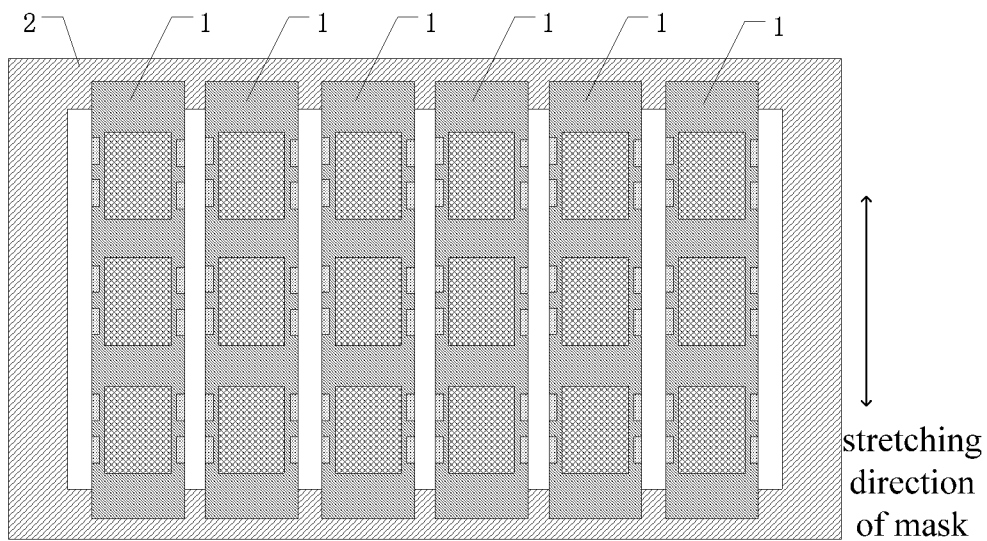
FIG. 5 is a schematic view of a mask assembly according to an embodiment of the present disclosure.

Referring to FIG. 5, FIG. 5 is a schematic view of a mask assembly according to an embodiment of the present disclosure. The mask assembly includes a frame 2 and a plurality of masks 1. The masks 1 are welded to the frame 2, and the masks are in a stretched state under the action of the frame 2, wherein the mask 1 can be a mask of the above structure, so as to effectively relieve the edge curling of the effective region for evaporation on the mask, thereby avoiding occurrence of defects in corresponding positions of the products to be coated during the evaporation process.

In addition, an embodiment of the present disclosure further provides a method for manufacturing a mask, comprising forming at least one mask cell. The mask cell includes an effective region for evaporation and an edge region between the effective region for evaporation and a first edge of the mask. The method further includes: forming a bending relieving structure on the edge region for relieving a curling of the edge of the effective region for evaporation when the mask is stretched in an extending direction of the first edge.

For example, the step of forming the bending relieving structure on the edge region comprises:

forming a pattern of the bending relieving structure on the edge region by a half-etching process, wherein a non-void area is arranged around a periphery of the bending relieving structure is, and a thickness of the non-hollowed-out area is less than a thickness of the bending relieving structure.

For example, the step of forming the bending relieving structure on the edge region comprises:

forming a pattern of the bending relieving structure on the edge region by a full-etching process, wherein a hollowed-out area is arranged around a periphery of the bending relieving structure.

The above embodiments are only intended for illustrating the present disclosure, rather than limiting the present disclosure. Various changes and modifications may be made by those skilled in the art without departing from the spirit and scope of the present disclosure. Therefore, all equivalent technical solutions also belong to the scope of the present disclosure, and the scope of the present disclosure should be defined by the appended claims.

What is claimed is:

1. A mask, comprising an effective region for evaporation and an edge region between an edge of the effective region for evaporation extending in a stretching direction and an edge of the mask extending in the stretching direction, wherein the edge region is provided with a bending relieving structure for relieving a curling of the edge of the effective region for evaporation when the mask is stretched in the stretching direction, wherein the bending relieving structure comprises a plurality of first strip-shaped structures and a second strip-shaped structure intersecting with the first strip-shaped structures, and an extending direction of the first strip-shaped structures is perpendicular to an extending direction of the second strip-shaped structure, and wherein the edge region comprises a first region and a second region that are adjacent to each other in the stretching direction, a distance between the first region and a center of the effective region for evaporation is greater than a distance between the second region and the center of the effective region for evaporation, and a distance between two adjacent first strip-shaped structures in the first region is greater than a distance between two adjacent first strip-shaped structures in the second region.

2. The mask according to claim 1, wherein the first strip-shaped structures extend in a direction which is not parallel the stretching direction.

3. The mask according to claim 2, wherein the extending direction of the first strip-shaped structures is perpendicular to the stretching direction.

4. The mask according to claim 1, wherein the extending direction of the second strip-shaped structure is parallel to the stretching direction.

5. The mask according to claim 1, wherein the mask comprises a plurality of mask cells, each mask cell comprising a plurality of the bending relieving structures.

6. The mask according to claim 1, wherein a non-hollowed-out area is arranged around a periphery of the bending relieving structure, and a thickness of the non-hollowed-out area is less than a thickness of the bending relieving structure.

7. The mask according to claim 1, wherein a hollowed-out area is arranged around a periphery of the bending relieving structure.

8. The mask according to claim 1, wherein the mask comprises a plurality of mask cells arranged in the stretching direction.

9. The mask according to claim 1, wherein the bending relieving structure is made from a same material as the effective region for evaporation of the mask.

10. A mask assembly, comprising a frame and the mask according to claim 1, the mask being mounted on the frame and configured to be stretched in the stretching direction.

11. A method for manufacturing a mask, the mask comprising an effective region for evaporation and an edge region between an edge of the effective region for evaporation extending in a stretching direction and an edge of the mask extending in the stretching direction, wherein the method comprises:

forming the effective region for evaporation and the edge region;

forming a bending relieving structure in the edge region such that the bending relieving structure relieves a curling of the edge of the effective region for evaporation when the mask is stretched in the stretching direction, wherein the bending relieving structure comprises a plurality of first strip-shaped structures and a second strip-shaped structure intersecting with the first strip-shaped structures, and an extending direction of the first strip-shaped structures is perpendicular to an extending direction of the second strip-shaped structure, and wherein the edge region comprises a first region and a second region that are adjacent to each other in the stretching direction, a distance between the first region and a center of the effective region for evaporation is greater than a distance between the second region and the center of the effective region for evaporation, and a distance between two adjacent first strip-shaped structures in the first region is greater than a distance between two adjacent first strip-shaped structures in the second region.

12. The method according to claim 11, wherein the forming the bending relieving structure in the edge region comprises:

forming a pattern of the bending relieving structure in the edge region by a half-etching process, such that a non-hollowed-out area is arranged around a periphery of the bending relieving structure, a thickness of the non-hollowed-out area is less than a thickness of the bending relieving structure.

13. The method according to claim 11, wherein the forming the bending relieving structure in the edge region comprises:

forming a pattern of the bending relieving structure in the edge region by a full-etching process, such that a hollowed-out area is arranged around a periphery of the bending relieving structure.

14. The method according to claim 11, wherein the forming the bending relieving structure in the edge region comprises:

forming a pattern of the bending relieving structure in the edge region by an attaching process.

15. The method according to claim 14, wherein the bending relieving structure protruding from a plane of the mask is formed by the attaching process.

16. The mask according to claim 2, wherein the bending relieving structure is made from a same material as the effective region for evaporation of the mask.

\* \* \* \* \*